United States Patent
Matero et al.

[11] Patent Number: 6,125,266
[45] Date of Patent: Sep. 26, 2000

[54] DUAL BAND ARCHITECTURES FOR MOBILE STATIONS HAVING TRANSMITTER LINEARIZATION FEEDBACK

[75] Inventors: Jorma Matero; Kari Kananen, both of Oulu, Finland

[73] Assignee: Nokia Mobile Phones Limited, Espoo, Finland

[21] Appl. No.: 09/001,776

[22] Filed: Dec. 31, 1997

[51] Int. Cl.$^7$ .................................................. H01Q 11/12
[52] U.S. Cl. ........................ 455/126; 455/552; 455/313; 375/296
[58] Field of Search .............................. 455/76, 552, 553, 455/114, 112, 313, 314, 126; 375/296, 297; 330/149, 51; 370/321, 335, 337, 342, 347, 441

[56] References Cited

U.S. PATENT DOCUMENTS

| | | | |
|---|---|---|---|
| 4,501,018 | 2/1985 | Shanley et al. | 455/83 |
| 5,124,672 | 6/1992 | Kuisma | 332/103 |
| 5,291,474 | 3/1994 | Ikonen et al. | 370/30 |
| 5,301,367 | 4/1994 | Heinonen | 455/76 |
| 5,390,168 | 2/1995 | Vimpari | 370/30 |
| 5,392,460 | 2/1995 | Mattila et al. | 455/76 |
| 5,414,431 | 5/1995 | McCoskey | 342/352 |
| 5,423,076 | 6/1995 | Westergren et al. | 455/86 |
| 5,471,652 | 11/1995 | Hulkko | 455/76 |
| 5,475,677 | 12/1995 | Arnold et al. | 370/280 |
| 5,507,014 | 4/1996 | Wray et al. | 455/115 |
| 5,519,885 | 5/1996 | Vaisanen | 455/76 |
| 5,574,990 | 11/1996 | Flanagan | 455/115 |
| 5,722,056 | 2/1998 | Horowitz et al. | 455/126 |
| 5,740,520 | 4/1998 | Cyze et al. | 455/69 |
| 5,758,266 | 5/1998 | Kornfeld et al. | 455/86 |
| 5,758,294 | 5/1998 | Ganesan et al. | 455/561 |
| 5,812,951 | 9/1998 | Ganesan et al. | 455/445 |
| 5,867,065 | 2/1999 | Leyendecker | 330/149 |
| 5,894,496 | 4/1999 | Jones | 455/126 |
| 5,905,760 | 5/1999 | Schnabl et al. | 375/296 |

FOREIGN PATENT DOCUMENTS

WO93/16560  8/1993  WIPO .

OTHER PUBLICATIONS

"High Frequency Part Of A Real Time Test Mobile Station For UMTS System Evaluations", Kari Lehtinen et al., 24$^{th}$ European Microwave Conference, vol. 2, pp. 1575–1580, Sep. 1994.

"GSM And Dect–A Dual Mode Solution", Rashidzadeh et al., Mobile Communications International 21, Apr. 1995, pp. 57–60.

*Primary Examiner*—Reinhard J. Eisenzopf
*Assistant Examiner*—Charles N. Appiah
*Attorney, Agent, or Firm*—Ohlandt, Greeley, Ruggerio & Perle, L.L.P.

[57] ABSTRACT

This invention teaches methods and apparatus for providing a low cost, low complexity, and low component count transmitter feedback function for use in mobile station transmitter linearization and self-test operations. Disclosed is a method for operating a mobile station of a type that includes a transmit chain having an output coupled to an antenna and a receive chain having an input coupled to the same or a different antenna. The method includes steps of: during a transmission time, (a) sampling an amplified signal prior to the amplified signal being applied to the antenna for transmission from the transmit chain; (b) downconverting a frequency of the sampled amplified signal to a lower frequency signal using a receive chain local oscillator signal normally used for downconverting a received signal to the first IF; and (c) demodulating the lower frequency signal to a baseband signal with a receive chain demodulator by using a second local oscillator signal that is normally used as a transmit chain modulator injection frequency signal. A further step of the method determines from the baseband signal an amount of predistortion of an input signal to the transmit chain in order to obtain a desired amount of linearization of the amplified signal.

16 Claims, 5 Drawing Sheets

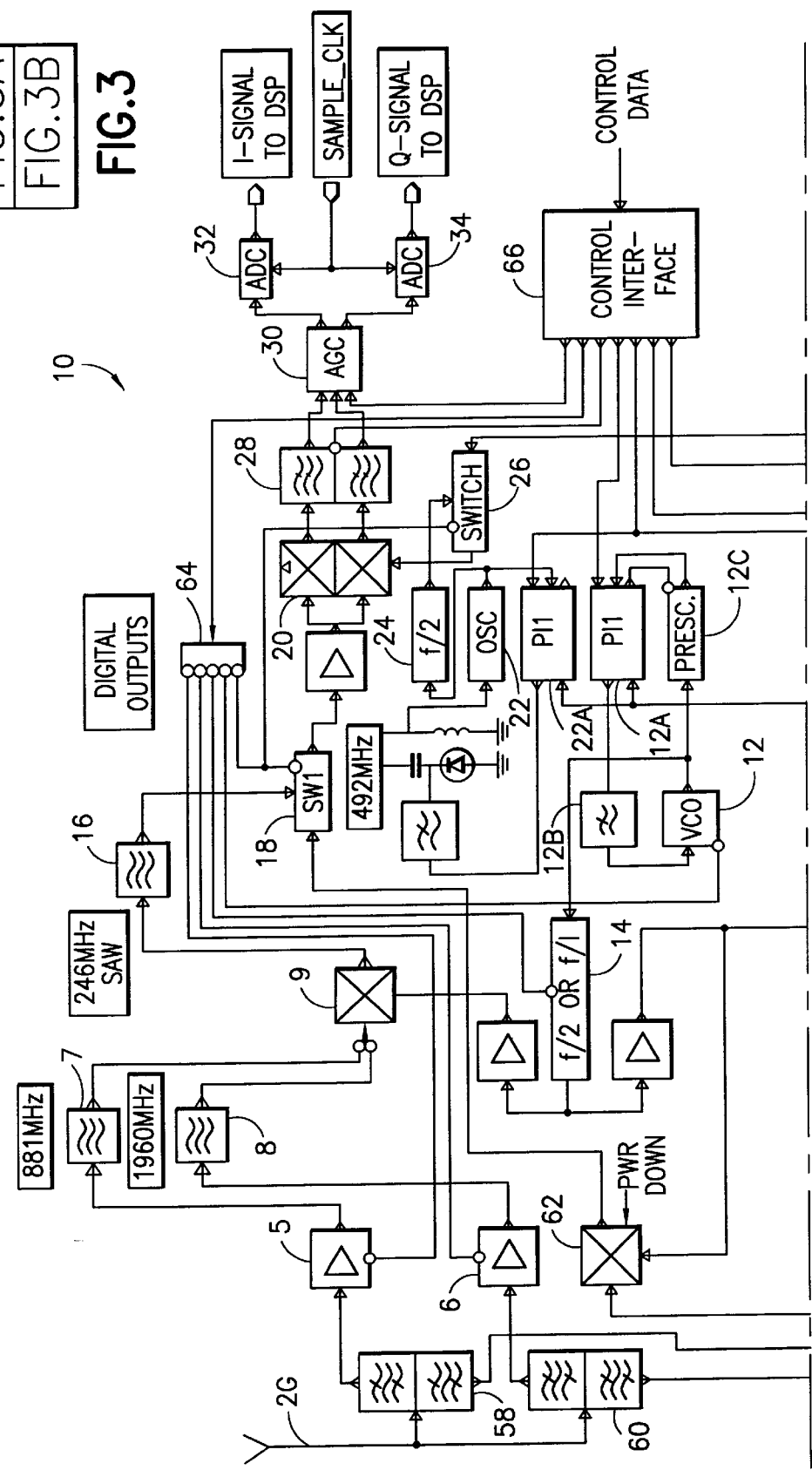

DUAL BAND ARCHITECTURES FOR MOBILE STATIONS HAVING TRANSMITTER LINEARIZATION FEEDBACK

FIELD OF THE INVENTION

This invention relates generally to radiotelephones and, in particular, to radiotelephones or mobile stations such as those capable of operation with a cellular network.

BACKGROUND OF THE INVENTION

The demand for so called dual mode terminals or mobile stations is expected to increase with time. In the United States of America there is presently at least one system which supports dual mode operation, i.e., digital time division multiple access (TDMA) and analog frequency modulation (FM), also referred to as DAMPS. As other systems such as GSM, PCS, DECT, DCS1800 and TDMA1900 become more widely used there is expected to be a need to have mobile stations which support two modes of operation, such as GSM and DCS1800 or DAMPS and TDMA 1900 or DCS1900. A proposed third generation mobile telecommunication systems, such as UMTS (in ETSI) or FPLMTS (in CCIR), is under development. These advanced systems may also require some type of dual mode operation.

In an article entitled "GSM and DECT-A Dual Mode Solution", Mobile Communications International Apr. 21, 1995, pgs. 57–60, B. Rashidzadel et al. describe an RF subsystem in FIG. 3 for a dual mode handset that operates in the GSM frequency band (890–960 MHz) and the DECT frequency band (1880–1900 MHz). In the transmitter portion a single I/Q modulator provides direct modulation at either the DECT or GSM frequency bands, and is connected through a SPDT switch to one of a DECT or a GSM transmitter chain. In the receiver portion separate DECT and GSM low noise amplifiers (LNAs) are used.

During the use of dual mode mobile stations an important consideration is power amplifier efficiency. Power amplifiers have a characteristic signal compression point. To improve efficiency it is typically desirable to operate as close to the compression point as possible. However, at the compression point the amplitude and signal phase changes (e.g., AM/AM and AM/PM conversion). This is not an important factor in the analog cellular mode, which has constant envelope FM modulation. However when using, for example, $\pi/4$ DQPSK modulation the operation near the compression point does become an important consideration.

Referring to FIG. 1, it can be seen that operation at the compression point results in the generation of higher order (e.g., third and fifth order) intermodulation products. The generation of the intermodulation products tends to spread the bandwidth of the transmitted signal such that a desired bandwidth (e.g., 30 KHz) is not achieved. This results in a leakage of transmitted signal energy into adjacent frequency channels, and thus an undesirable increase in interference between users.

It is known in the art to predistort the transmitted signal waveform in an attempt to compensate for the generation of the intermodulation products, and thus "linearize" the transmitted signal. For example, FIG. 2 shows a portion of a conventional approach to linearizing a transmitter signal. It is assumed that a mobile station includes a digital signal processor (DSP) section 1 and an RF section 2. The DSP 1 includes a modulator 1A that provides In-phase (I) and Quadrature (Q) signal channels to a predistortion block 1B wherein the I and Q digital values are modified (predistorted) to achieve a desired linearization of the transmitted waveform. The predistorted I and Q values are converted to analog signals with I and Q D/A converters 1C and 1D and applied to the RF section 2. In the RF section 2 the I/Q signals are mixed with a local oscillator (LO) signal (LO3) in a modulator 2A and upconverted to the transmission frequency. The modulated signal is applied to a gain controlled amplifier 2B, filtered by filter 2C, and power amplified by amplifier 2D before being applied at a transmission frequency ($F_{TX}$) through a directional coupler 2E to a duplex filter 2F and antenna 2G. Signals received from antenna 2G at a receive frequency ($F_{RX}$) are applied through the duplexer 2F to a low noise amplifier 2H and receive filter 21. The filtered received signal is next applied to a mixer 2J where it is mixed with a frequency supplied by LO1 and downconverted to a first intermediate frequency (IF), filtered by an IF filter 2K, and then applied to an IF signal processing block 2L where the IF is downconverted to baseband using a frequency locked to a voltage controller oscillator (VCTXO) 2M. The frequency of the VCTXO 2M is controlled by an automatic frequency control (AFC) signal output from a D/A converter 1L.

For predistortion linearization purposes it is necessary to generate a feedback signal from the transmitted signal. In FIG. 2 this is accomplished by providing a level-controlled amplifier A1 having an input coupled to an output of the directional coupler 2E. The output of A1 is applied to I/Q mixers 2N and 2O which are supplied by a separate mixing signal generated by a separate LO2. The desired phase shift between the LO2 inputs to the mixers 2N and 2O is provided by a LO phasing component 2P. The outputs of the mixers 2N and 2O are converted to digital values by A/D converters 1E and 1F. The digitized transmitter I/Q signals are supplied to the block 1B where an error calculation is performed in order to generate the required predistortion of the I/Q signals output from the modulator 1B, thereby maintaining the transmitted waveform within desired limits. The digitized I/Q signals from A/D converters 1E and 1F are also applied to a power calculation block 1G which provides an output to a summing node 1H where the calculated transmitter power is subtracted from a desired transmitter power level and ramp value generated by block 1I. The difference signal is applied to a loop filter 1J and then to a D/A converter 1K which supplies a gain control signal to the variable gain amplifier 2B, thus closing the power control loop.

It can be realized that the conventional approach to transmitter linearization outlined above and shown in FIG. 2 requires that additional components be provided, such as the amplifier A1, mixers 2N and 2O, LO2, the A/D converters 1E and 1F, and the LO2 phasing network for the mixers 2N and 2O. The addition of these components results in an increase in cost, size, complexity and power consumption, each of which is undesirable in the design and manufacturing of mobile stations, such as cellular radiotelephones.

While the transmitter linearization problem has been described above mainly in the context of TDMA-type terminals, similar problems arise in the operation of code division multiple access (CDMA)-type terminals.

OBJECTS AND ADVANTAGES OF THE INVENTION

It is a first object and advantage of this invention to provide a method for constructing and operating a mobile station, such as a personal communicator or a cellular radiotelephone, so as to reduce the component count to achieve savings in cost, size, complexity and power consumption.

It is a further object and advantage of this invention to provide a method for constructing and operating a dual band mobile station so as to provide an effective transmitter linearization function without requiring a significant increase in additional components.

It is another object and advantage of this invention to provide a TDMA or CDMA mobile station that implements a transmitter linearization function by the selective use of receiver components while transmitting.

SUMMARY OF THE INVENTION

The foregoing and other problems are overcome and the objects and advantages are realized by a mobile station that is constructed and operated in accordance with the teachings of this invention.

This invention teaches methods and apparatus for providing a low cost, low component count transmitter feedback function for use in transmitter linearization and self-test operations. Disclosed is a method for operating a mobile station of a type that includes a transmit chain having an output coupled to an antenna and a receive chain having an input coupled to the same or a different antenna. The method includes steps of: during a transmission time, (a) sampling an amplified signal prior to the amplified signal being applied to the antenna for transmission from the transmit chain; (b) downconverting a frequency of the sampled amplified signal to a lower frequency signal; and (c) demodulating the lower frequency signal to a baseband signal using a receive chain demodulator. A further step of the method determines from the baseband signal an amount of predistortion of an input signal to the transmit chain in order to obtain a desired amount of linearization of the amplified signal.

The step of downconverting includes a step of mixing the sampled amplified signal with a same local oscillator signal that is used in the receive chain to downconvert a signal received from the antenna. The step of demodulating includes a step of mixing the lower frequency signal with a same local oscillator signal that is used in the transmit chain to modulate an input signal to the transmit chain.

In one embodiment of this invention the steps of sampling, downconverting and demodulating occur during a transmitted burst of a TDMA waveform. In another embodiment of this invention the steps of sampling, downconverting and demodulating occur during a transmission of a CDMA waveform, and the step of demodulating includes steps of temporarily suspending an operation of a diversity receive chain, and executing the step of demodulating using a demodulator of the diversity receive chain.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 3B:
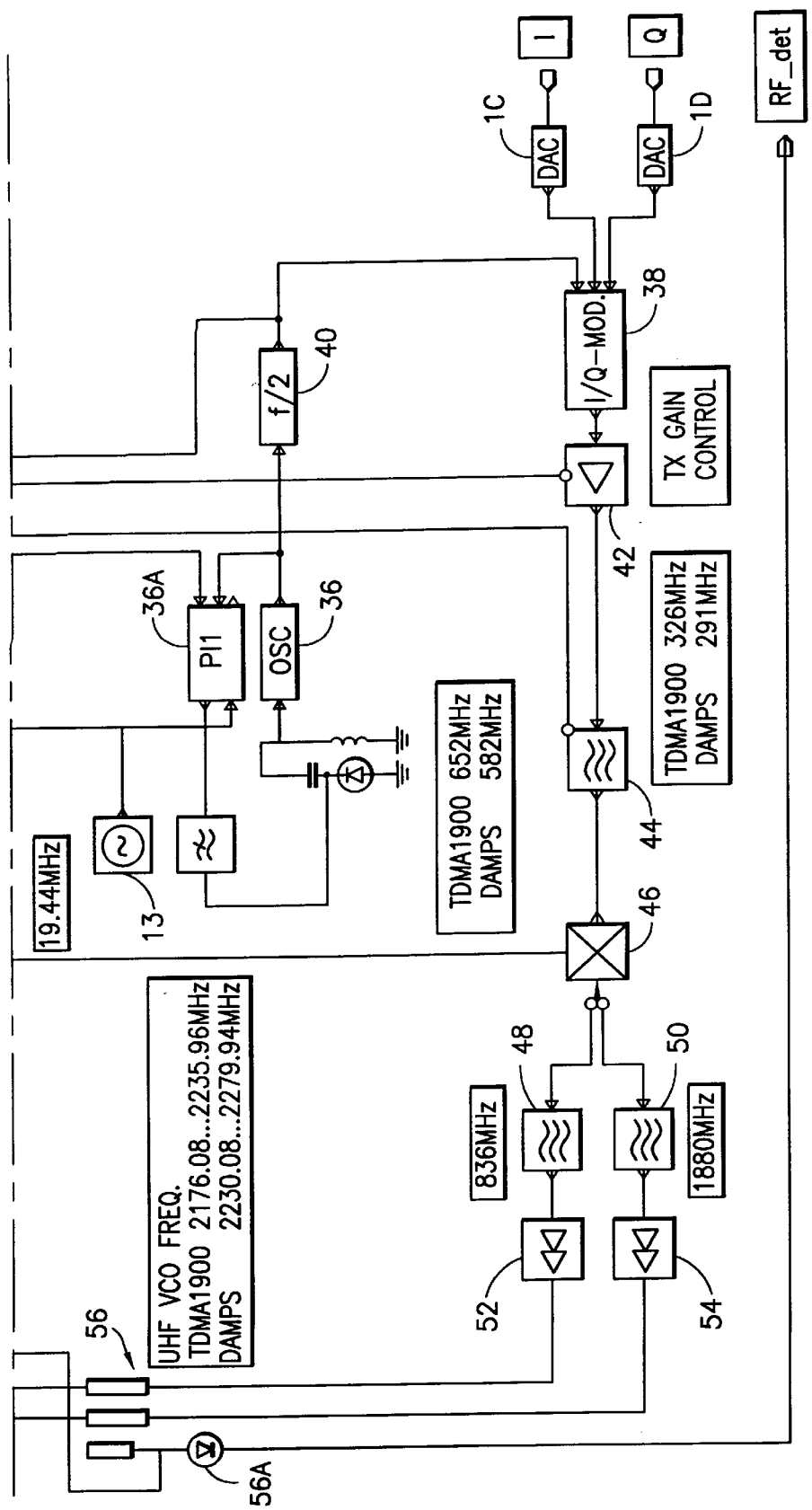
FIG. 3 is a circuit diagram of a first embodiment of this invention, specifically a dual band DAMPS/TDMA1900 RF transceiver.

Reference is now made to FIG. 3 for illustrating a circuit diagram of an exemplary dual band DAMPS/TDMA1900 RF transceiver 10 that is constructed and operated in accordance with this invention.

A receiver section is coupled to the antenna 2G through duplexers 58 and 60 (one for each band), low noise amplifiers 5 and 6, receive filters 7 (881 MHz) and 8 (1960 MHz), and a first IF downconversion mixer 9. The receiver section operates with a 246 MHz first IF. The first receiver LO signal is generated in a VCO module 12. The VCO module 12 operates in conjunction with a phased locked loop (PLL) 12A, filter 12B, and a prescaler 12C. All of the transceiver PLLs are fed from a master 19.44 MHz frequency reference 13. The frequency output from the VCO 12 is divided by two for DAMPS operation in divider 14 but used directly for 1900 MHz band operation.

The IF signal output from the downconversion mixer 9 passes through an IF filter (such as a 246 MHz SAW filter 16 optimized for a 30 KHz passband) and then through a switch (SW1 18) to a second mixer 20. For the second mixer 20 a 492 MHz oscillator 22, that includes a PLL 22A, feeds a frequency divider 24 which provides phased LO-signals via a second switch 26. The I/Q outputs of the mixers 20 are filtered with lowpass filters 28 and then applied to an AGC block 30 and finally to A/D converters 32 and 34 to provide sampled I/Q signals for the DSP 1 (not shown). The bandwidth of the baseband filters 28 is preferably tuneable in a range of about 0.5 the modulation bandwidth to about 2.5 time the modulation bandwidth, for example from about 15 KHz to about 90 KHz, and is a function of channel spacing.

On the transmit side an oscillator 36, that includes a PLL 36A, provides an injection frequency for the I/Q modulator 38. The injection frequency is divided by two in divider 40 to produce the phased LO signal for the I/Q modulator 38. The modulator 38 output signal passes through a transmitter (TX) gain control amplifier 42 and a TX filter 44 (DAMPS-291 MHz, TDMA1900-326 MHz) before being upconverted in mixer 46 either to the 836 MHz band for DAMPS operation or to the 1850 MHz band for TDMA1900 operation. The upconversion mixer 46 is also driven by either the fundamental or divided output of the VCO 12, depending on the band of operation. The upconverted signal from the mixer 46 is passed through either an 836 MHz filter 48 (DAMPS) or an 1880 MHz filter 50 (TDMA1900) before being applied to one of the power amplifiers 52 or 54 (depending on the selected band), directional coupler 56, and one of duplexers 58 or 60 prior to transmission from the antenna 2G. The power amplifiers 52, 54 are preferably operated class A-B in the digital mode.

This embodiment of the invention exploits the fact that the DAMPS/TDMA1900 is a time domain multiplexing system (i.e., the receiver and transmitter sections are not operating simultaneously) to use certain of the receiver blocks to provide the transmitter feedback for linearization purposes. In this embodiment of the invention the same VCO 12 signal is also used for transmitter feedback downconversion to the IF frequency, via a mixer 62, which is actually the same as the modulator 38 output frequency. To this end an output is taken from the directional coupler 56, prior to a detection diode 56A used for TX power control purposes, and applied to the downconversion mixer 62. The directional coupler 56 may thus be considered to sample the amplified signal prior to the application of the amplified signal to the antenna. The output of the mixer 62 is applied to the switch 18 (SW1), which is controlled by a digital signal from a latch 64 and a control interface 66 coupled to the DSP 1 (not shown). The mixer 62 is preferably powered down when in the receive mode to conserve power. The downconverted signal is fed via the switch 18 to the receiver second IF mixer 20. In the receive mode the switch 18 is controlled by the digital signal from latch 64 to connect the receiver IF filter 16 to the receiver second IF signal path, while in the transmit mode (when the receiver is normally not used) the output of the transmitter downconversion mixer 62 is connected into the receiver IF signal path.

In order to generate the required baseband I/Q signals a LO signal is required to have the same frequency as the downconverted transmitter feedback signal output from the mixer 62. This signal is already available in the modulator section at the output of the divider 40 as the phased modulator injection signals, which are selectively applied in the transmit mode through the switch 26. The AGC block 30 adjusts the transmitter feedback signal to an acceptable level for the A/D converters 32 and 34. The AGC can be set accordingly from the control interface 66 for different transmitter power levels. The control data input to the control interface 66 from the DSP 1 can be via a parallel or a serial data bus.

The tuneable baseband filter 28 is an important component, as in the basic receive mode it provides much of the receiver selectivity (i.e., attenuation for adjacent channel interference). In this case the corner frequency is about half the RF modulation bandwidth (in DAMPS about 15 KHz).

While in the linearization feedback mode there is a need to also receive signal power at two adjacent channels (in DAMPS at 30 KHz and 60 KHz offsets), which contain the distortion products of the 3rd and 5th order. Therefore, in this case the corner frequency is preferably about 2.5 times the modulation bandwidth.

It should be noted that many of the components shown in FIG. 3 can be integrated into a single integrated circuit package, with the certain of the PLL components and filters being external to the package.

It should further be noted that the circuit construction shown in FIG. 3 can be used to provide a factory or field self-test function, as a portion of the transmitted signal can be fed back through the portion of the receiver chain following the switch 18 and input to the DSP.

Figure 1:
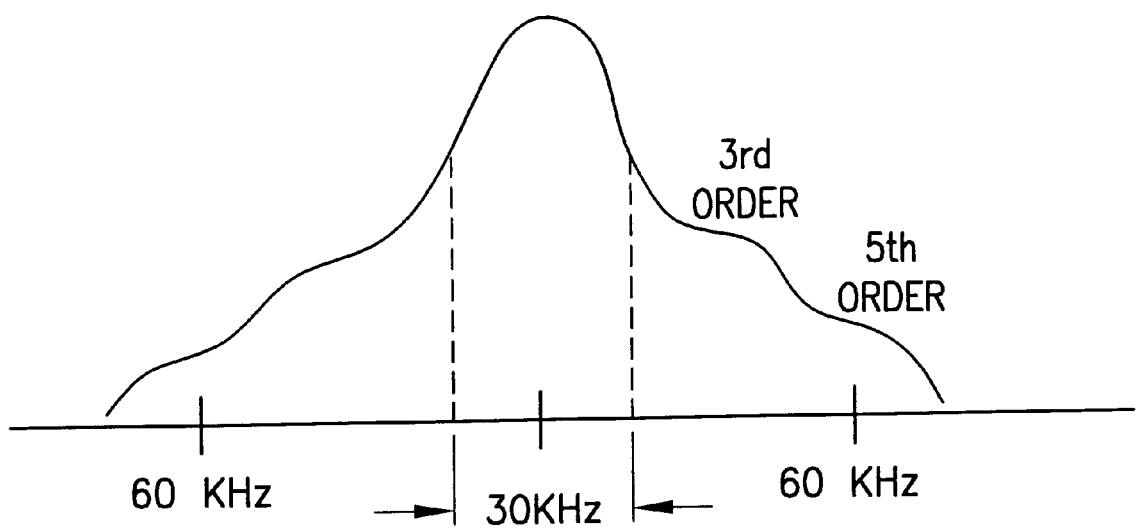
FIG. 1 is graph that illustrates the generation of undesirable intermodulation products for a power amplifier operated at its compression point.
Figure 2:
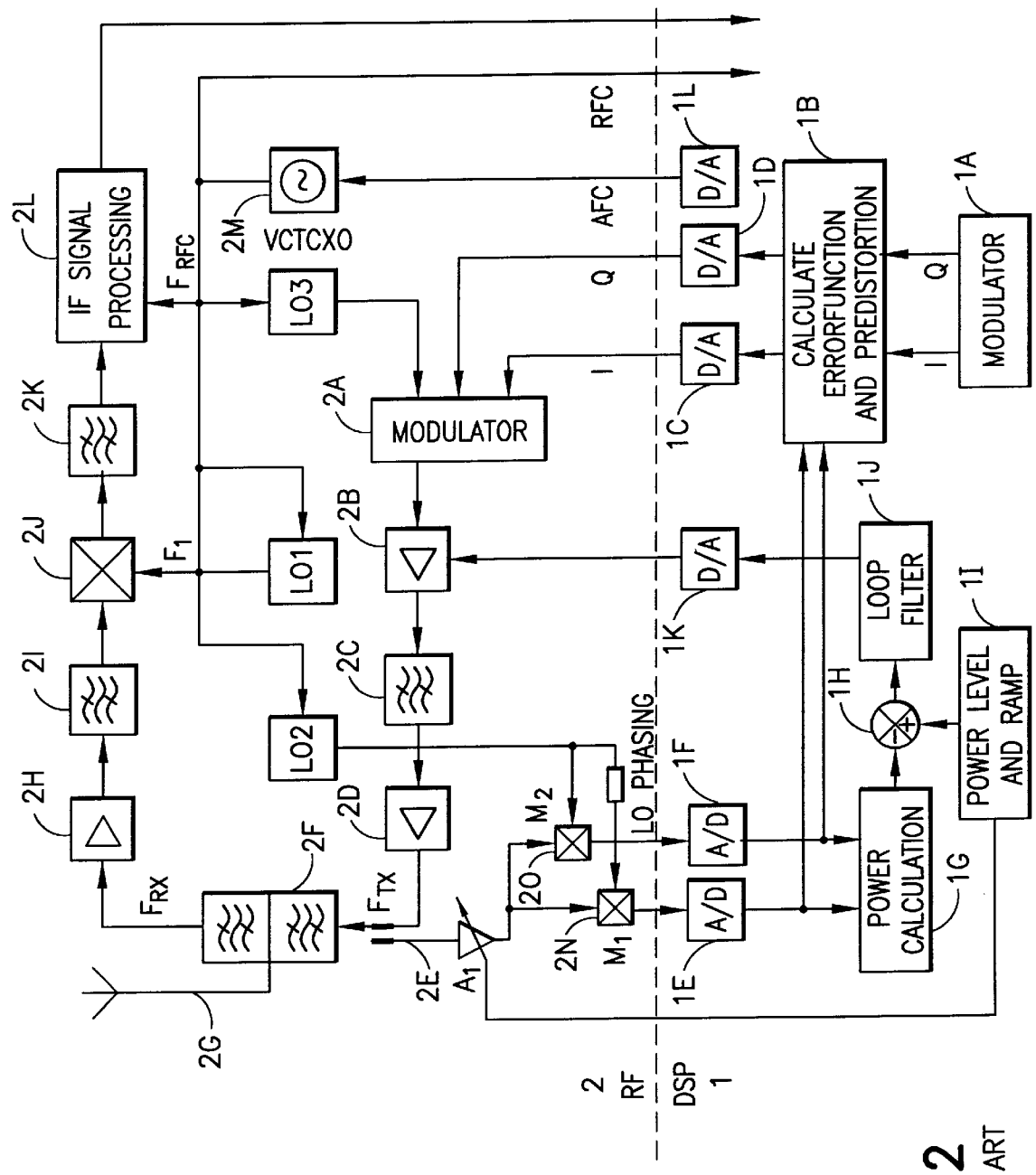
FIG. 2 is a circuit diagram of a conventional approach to transmitter linearization.

As was made apparent above, for transmitter linearization with predistortion there is a need to provide feedback from the TX power amplifier. This is accomplished in the embodiment of FIG. 3 by providing the mixer 62, switches 18 and 26, and the bandwidth tuneable baseband filters 28. The switch 18 operates to selectively couple the output of the mixer 62 to the second (baseband) mixer 20 during the transmit portion of the TDMA timing cycle (when the mixer 20 would not normally be used), and couples the output of the IF filter 16 to the second mixer 20 at all other times. In like manner the switch 26 couples the modulator 38 injection Lo to the mixer 20 only while the switch 18 is coupling the output of the TX downconversion mixer 62 to the baseband mixer 20, and couples the output of the normal receive LO 22 to the mixer 20 at all other times. Comparing FIG. 3 to FIG. 2, it can be appreciated that a significant savings in components, complexity, space and power is achieved by the circuit that is constructed and operated in accordance with this invention.

Figure 4:
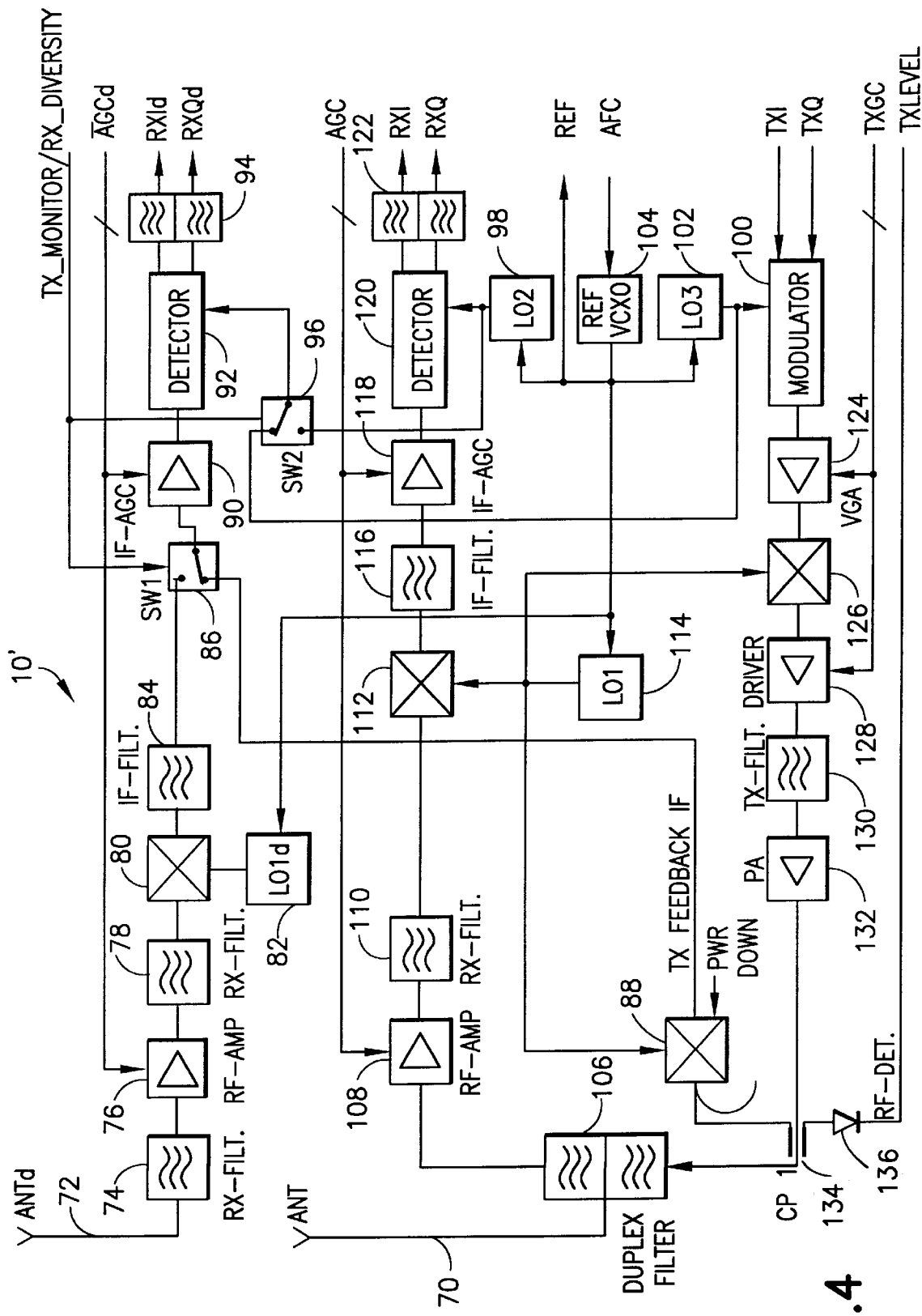
FIG. 4 is a block diagram of a second embodiment of this invention, specifically a CDMA RF transceiver.

Referring now to FIG. 4, there is illustrated a CDMA mobile station 10' embodiment of this invention. In this embodiment a diversity branch of the CDMA receiver is used to provide the transmitter power amplifier feedback. That is, for a case where the CDMA mobile station 10' includes a diversity receiver the inventors have determined that it is possible to periodically interrupt the reception in the diversity branch and to use some of the diversity branch components to make linearization feedback measurements, while the main receive branch is used in a normal manner for reception.

In FIG. 4 the CDMA mobile station 10' is provided with a primary antenna (ANT) 70 and a diversity antenna (ANTd) 72. In a diversity receiver branch the ANTd 72 is connected to a receive filter 74. The output of the filter 74 is connected to a gain controlled RF amplifier 76 followed by a receive filter 78 and a downconversion mixer 80. The downconversion mixer 80 is driven with a diversity local oscillator (LO1$d$) 82. The output of the mixer 80 is applied to an IF filter 84 and thence to a switch 86. The state of the switch 86 is controlled by a digital signal TX_monitor/RX_diversity so as to switch between the output of the IF filter 84 and an output of a transmit feedback downconversion mixer 88. Continuing with the diversity reception branch, the output of the switch 86 feeds an input of an IF amplifier 90 and an I/Q demodulator or detector 92. The output of the detector 92 is provided to baseband filters 94 that output diversity receiver branch I/Q signals. A detector local frequency is supplied through a second switch 96 that supplies one of a normal receive demodulator local frequency from oscillator LO2 98 or the transmit chain modulator 100 LO frequency supplied by the oscillator LO3 102. A reference VXCO 104 provides a reference frequency to all of the local oscillators.

Turning now to the normal transmit and receive chains, the antenna 70 is connected to a duplex filter 106 having an output connected to a receive RF amplifier 108. Amplifier 108 is controlled by an automatic gain control (AGC) signal, whereas the diversity RF amplifier 76 is controlled by a separate diversity AGC diversity signal. The output of the RF amplifier 108 is connected to a receive filter 110 and a downconversion mixer 112. Mixer 112 is supplied with a local oscillator signal LO1 114. The output of the downconversion mixer 112 is the normal IF signal that is filtered by IF filter 116 and amplified by IF amplifier 118. The output of the amplifier 118 feeds an I/Q detector 120 which provides I/Q signals via baseband filters 122. The detector 120 is driven by the output of LO2 98.

The transmit portion includes the I/Q modulator 100 which provides an output to a gain controlled amplifier 124. The output of amplifier 124 is upconverted to the transmission frequency in a mixer 126 that operates in conjunction with the output of LO1 114. The output of the upconversion mixer 126 is provided to the antenna 70 through a driver amplifier 128, a transmit filter 130, a power amplifier 132, and a directional coupler 134. The directional coupler 134 outputs a detected RF signal via detection diode 136 to provide a conventional transmit level signal to power control circuitry (not shown).

In accordance with this embodiment of the invention the directional coupler 134 also provides an output to the transmit feedback downconversion IF mixer 88 which feeds the resulting IF signal (the transmit frequency is mixed with the output of LO1) to the diversity branch detector via switch 86. In this manner the operation of the diversity receiver branch is temporarily suspended by controlling switches 86 and 96 to select the output of the TX feedback IF mixer 88 and the output of LO3 102 to be inputs to the detector 92. The normal diversity I/Q signals RXId and RXQd signals are thus replaced by TX feedback I/Q signals TXFI and TXFQ and are input to the DSP after being digitized in respective A/D converts (not shown). These signals are then operated on by the DSP to determine the correct amount of predistortion for the TXI and TXQ signals input to the modulator 100 in order to achieve the desired amount of TX linearization. As with the mixer 62 embodiment of FIG. 3, the mixer 88 is preferably placed in a reduced power consumption mode when the switch 86 does not couple the transmit amplifier downconverted signal to the input of the detector 92.

In that CDMA is a full duplex system, as opposed to the half duplex TDMA embodiment of FIG. 3, a conventional technique would require a complicated feedback structure with two mixers, baseband filtering, two A/D converters and an additional injection signal for downconversion. In this embodiment of the invention the number of components is significantly reduced, since certain of the diversity receiver chain circuits are used for the linearization feedback function, specifically the amplifier 90, detector 92, LO3 102, and baseband filters 94. The additional injection signals (LO1 and LO3) are provided with no additional cost.

In this embodiment the transmitter feedback is comprised of a limited number of samples taken between relatively long intervals, and predistortion components for the modulation signals TXI and TXQ are calculated based on these samples. To accomplish feedback sampling there is thus an interruption in the diversity reception function. However, if the TX sampling periods are relatively short, only a minimal degradation in receive performance is experienced, since the main receiver branch operates with full functionality during transmit feedback sampling. The actual duration of the sampling periods, and the time between sampling periods, can be fixed, or can be made variable for adapting to current reception conditions. Suitable values could be in the range of a few milliseconds, and when power level changes are required. Additionally, and as was the case for the embodiment of FIG. 3, this transmitter feedback technique can be used for self-test purposes.

Although described in the context of preferred embodiments, it should be realized that a number of modifications to these teachings may occur to one skilled in the art. By example, the teachings of this invention are not limited to only the specific frequency bands or local oscillator and filter frequencies described above. Nor is the teaching of this invention limited for use only with the above-described IF frequencies, or limited for use in only a dual-band mobile station, as the teachings of this invention can be applied as well to single band receivers.

Thus, while the invention has been particularly shown and described with respect to preferred embodiments thereof, it will be understood by those skilled in the art that changes in form and details may be made therein without departing from the scope and spirit of the invention.

What is claimed is:

1. A mobile station for conducting bidirectional wireless communications, comprising:
   a transmit chain including a modulator, an upconverter for converting an output of the modulator to a transmit frequency signal, and a transmit amplifier having an input coupled to an output of the upconverter for amplifying said transmit frequency signal;
   a receive chain including a receiver, a downconverter for converting an output of the receiver to an intermediate frequency (IF) signal, and a demodulator having an input coupled to an output of the downconverter;
   circuitry for downconverting an output of said transmit amplifier to said IF signal and for selectively coupling said transmit amplifier downconverted signal to said input of said demodulator; and
   circuitry coupled to an output of said demodulator for determining an amount of predistortion to be applied to signals input to said modulator to achieve a desired amount of transmit frequency signal linearization.

2. A mobile station as in claim 1, wherein said upconverter and also said circuitry for downconverting said output of said transmit amplifier are coupled to a same local oscillator signal.

3. A mobile station as in claim 1, wherein said mobile station operates in accordance with a time division multiple access (TDMA) technique, and wherein said circuitry for selectively coupling couples said transmit amplifier downconverted signal to said input of said demodulator only during a transmission period of the TDMA timing cycle.

4. A mobile station as in claim 1, wherein said mobile station operates in accordance with a code division multiple access (CDMA) technique, wherein said receive chain forms a part of a diversity reception chain, and wherein said circuitry for selectively coupling periodically interrupts the operation of said diversity reception chain and couples said transmit amplifier downconverted signal to said input of said demodulator.

5. A mobile station as in claim 1, wherein said demodulator is comprised of an I channel baseband filter and a Q channel baseband filter, and wherein said I and Q channel base band filters have a bandwidth that is tuneable within a predetermined range of bandwidths.

6. A mobile station as in claim 5, wherein said range of bandwidths is about 0.5 the modulation bandwidth to about 2.5 times the modulation bandwidth.

7. A mobile station as in claim 1, wherein said circuitry for downconverting is placed in a reduced power consumption mode when said circuitry for selectively coupling does not couple said transmit amplifier downconverted signal to said input of said demodulator.

8. A mobile station as in claim 1, and further comprising circuitry for selectively coupling one of a receiver local oscillator signal to said demodulator or a modulator injection frequency signal to said demodulator, wherein said modulator injection frequency signal is coupled to said demodulator only when said circuitry for selectively coupling couples said transmit amplifier downconverted signal to said input of said demodulator.

9. A method for operating a mobile station of a type that includes a transmit chain having an output coupled to an antenna and a receive chain having an input coupled to the same or a different antenna, comprising steps of:
   during a transmission time, sampling an amplified signal prior to the amplified signal being applied to the antenna for transmission from the transmit chain;
   downconverting a frequency of the sampled amplified signal to a lower frequency signal;
   selectively coupling, during the transmission time, the lower frequency signal to an input of a receive chain demodulator, the receive chain demodulator normally being used, during a reception time, for demodulating a downconverted received signal; and
   demodulating the lower frequency signal to a baseband signal using the receive chain demodulator.

10. A method as in claim 9, and further comprising a step of determining from the baseband signal an amount of predistortion of an input signal to the transmit chain in order to obtain a desired amount of linearization of the amplified signal.

11. A method as in claim 9, wherein the step of downconverting includes a step of mixing the sampled amplified signal with a local oscillator signal that is used in the receive chain, during the reception time, to downconvert a signal received from the antenna that is coupled to the input of the receive chain.

12. A method as in claim 9, wherein the step of demodulating includes a step of mixing the lower frequency signal with a local oscillator signal that is used in the transmit chain as a carrier to be modulated with an input signal to the transmit chain.

13. A method as in claim 9, wherein the steps of sampling, downconverting and demodulating use receive chain circuitry and occur during a transmitted burst of a TDMA waveform.

14. A method as in claim 9, wherein the step of sampling is executed by a directional coupler that is coupled between an output of a transmit power amplifier and the antenna.

15. A method as in claim 9, wherein the step of downconverting includes a step of mixing the sampled amplified signal with a local oscillator signal that is used in the transmit chain to upconvert a signal to a transmission frequency.

16. A method for operating a mobile station of a type that includes a transmit chain having an output coupled to an antenna and a receive chain having an input coupled to the same or a different antenna, comprising steps of:

during a transmission time, sampling an amplified signal prior to the amplified signal being applied to the antenna for transmission from the transmit chain;

downconverting a frequency of the sampled amplified signal to a lower frequency signal; and demodulating the lower frequency signal to a baseband signal using a receive chain demodulator, wherein the steps of sampling, downconverting and demodulating occur during a transmission of a CDMA waveform, and wherein the step of demodulating includes steps of temporarily suspending an operation of a diversity receive chain, and executing the step of demodulating using a demodulator of the diversity receive chain.

* * * * *